(12) United States Patent
Shih et al.

(10) Patent No.: US 10,163,836 B2
(45) Date of Patent: Dec. 25, 2018

(54) CONDUCTIVE EXTERNAL CONNECTOR STRUCTURE AND METHOD OF FORMING

(71) Applicant: Taiwan Semiconductor Manufacturing Company, Ltd., Hsinchu (TW)

(72) Inventors: Meng-Fu Shih, Nantou County (TW); Chun-Yen Lo, Hsinchu (TW); Cheng-Lin Huang, Hsinchu (TW); Wen-Ming Chen, Zhunan Township (TW); Chien-Ming Huang, Hsinchu (TW); Yuan-Fu Liu, Kaohsiung (TW); Yung-Chiuan Cheng, Kaohsiung (TW); Wei-Chih Huang, Taipei (TW); Chen-Hsun Liu, Tainan (TW); Chien-Pin Chan, Pingzhen (TW); Yu-Nu Hsu, Tainan (TW); Chi-Hung Lin, Kaohsiung (TW); Te-Hsun Pang, Tainan (TW); Chin-Yu Ku, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/877,186

(22) Filed: Jan. 22, 2018

(65) Prior Publication Data
US 2018/0166409 A1 Jun. 14, 2018

Related U.S. Application Data

(62) Division of application No. 14/942,226, filed on Nov. 16, 2015, now Pat. No. 9,875,979.

(51) Int. Cl.
*H01L 23/00* (2006.01)
*C25D 17/00* (2006.01)
*H01L 23/31* (2006.01)

(52) U.S. Cl.
CPC ............ *H01L 24/11* (2013.01); *C25D 17/001* (2013.01); *H01L 24/13* (2013.01); *H01L 24/742* (2013.01);
(Continued)

(58) Field of Classification Search
CPC ....................................................... H01L 24/11
See application file for complete search history.

(56) References Cited

U.S. PATENT DOCUMENTS 6,501,185 B1 12/2002 Chow et al.
7,651,937 B2 1/2010 Hsieh et al.
(Continued)

FOREIGN PATENT DOCUMENTS

DE 214719 A1 10/1984
KR 20090082691 A 7/2009
(Continued)

*Primary Examiner* — William Harriston
(74) *Attorney, Agent, or Firm* — Slater Matsil, LLP

(57) ABSTRACT

External electrical connectors and methods of forming such external electrical connectors are discussed. A method includes forming an external electrical connector structure on a substrate. The forming the external electrical connector structure includes plating a pillar on the substrate at a first agitation level affected at the substrate in a first solution. The method further includes plating solder on the external electrical connector structure at a second agitation level affected at the substrate in a second solution. The second agitation level affected at the substrate is greater than the first agitation level affected at the substrate. The plating the solder further forms a shell on a sidewall of the external electrical connector structure.

20 Claims, 9 Drawing Sheets

(52) U.S. Cl.
CPC .. *H01L 23/3192* (2013.01); *H01L 2224/0345* (2013.01); *H01L 2224/03912* (2013.01); *H01L 2224/0401* (2013.01); *H01L 2224/05022* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05166* (2013.01); *H01L 2224/05582* (2013.01); *H01L 2224/05647* (2013.01); *H01L 2224/1111* (2013.01); *H01L 2224/1146* (2013.01); *H01L 2224/1147* (2013.01); *H01L 2224/11849* (2013.01); *H01L 2224/13017* (2013.01); *H01L 2224/1357* (2013.01); *H01L 2224/13083* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13551* (2013.01); *H01L 2224/13566* (2013.01); *H01L 2224/13611* (2013.01); *H01L 2924/01047* (2013.01)

(56) References Cited

U.S. PATENT DOCUMENTS

| | | | |
|---|---|---|---|
| 8,486,234 | B2 | 7/2013 | Saito et al. |
| 8,653,659 | B2 | 2/2014 | Chang |
| 9,018,758 | B2 | 4/2015 | Hwang et al. |
| 2003/0151140 | A1* | 8/2003 | Nishiyama ............ H01L 21/563 257/737 |
| 2004/0245094 | A1 | 12/2004 | McHugh et al. |
| 2008/0067072 | A1 | 3/2008 | Kim et al. |
| 2008/0116077 | A1 | 5/2008 | Sricharoenchaikit |
| 2011/0006416 | A1 | 1/2011 | Tseng et al. |
| 2012/0193787 | A1 | 8/2012 | Maitani et al. |
| 2013/0320524 | A1 | 12/2013 | Chuang et al. |
| 2015/0262953 | A1 | 9/2015 | Lee et al. |

FOREIGN PATENT DOCUMENTS

| | | |
|---|---|---|
| KR | 20130135042 A | 12/2013 |
| KR | 20150107582 A | 9/2015 |
| TW | 531873 B | 5/2003 |
| TW | 200709311 A | 3/2007 |
| TW | 201145482 A | 12/2011 |

\* cited by examiner

CONDUCTIVE EXTERNAL CONNECTOR STRUCTURE AND METHOD OF FORMING

PRIORITY CLAIM AND CROSS-REFERENCE

This application is a division of U.S. patent application Ser. No. 14/942,226, entitled "Conductive External Connector Structure and Method of Forming," filed on Nov. 16, 2015, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area.

This improved integration density has led, in some instances, to smaller integrated circuit dies. The decrease in size of integrated circuit dies can cause a need for smaller external electrical connectors arranged in a higher density. However, the smaller external electrical connectors and the higher density of them can result in problems that may have previously not been encountered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
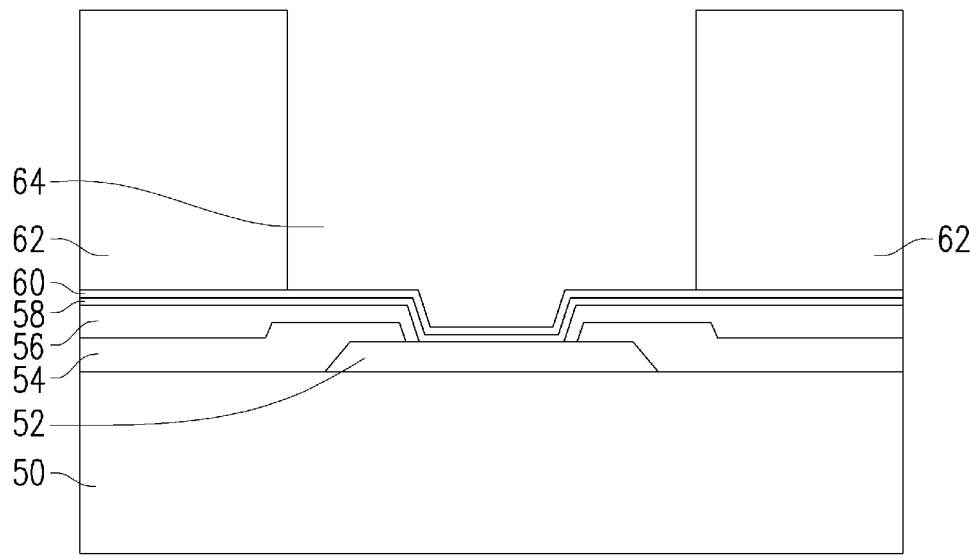
FIGS. 1 through 4 are cross-sectional views of intermediate steps in the manufacturing of a conductive external connector in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a conductive external connector, such as a pillar with solder thereon, formed on a substrate, such as an integrated circuit die, and methods of forming such a conductive connector. Other embodiments contemplate other applications, such as on a package component or the like, that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

Figure 3:
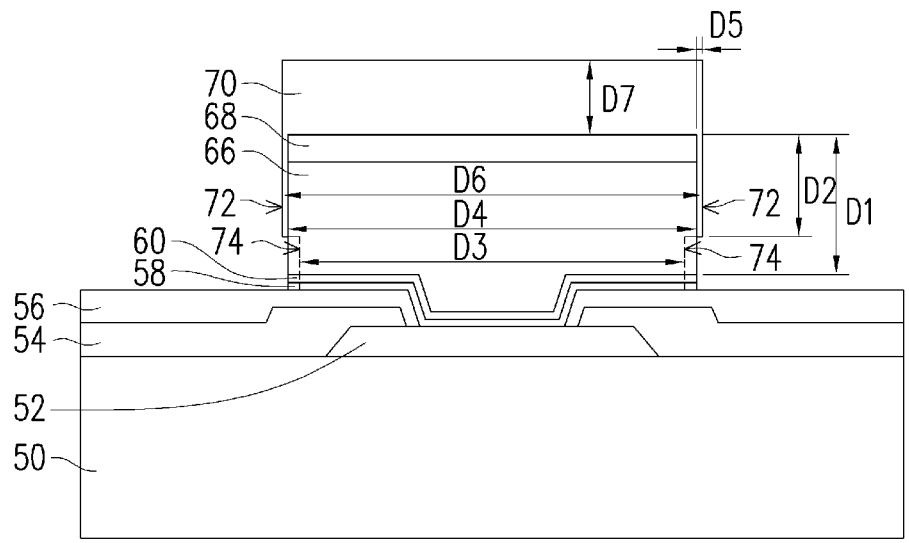
Figure 4:
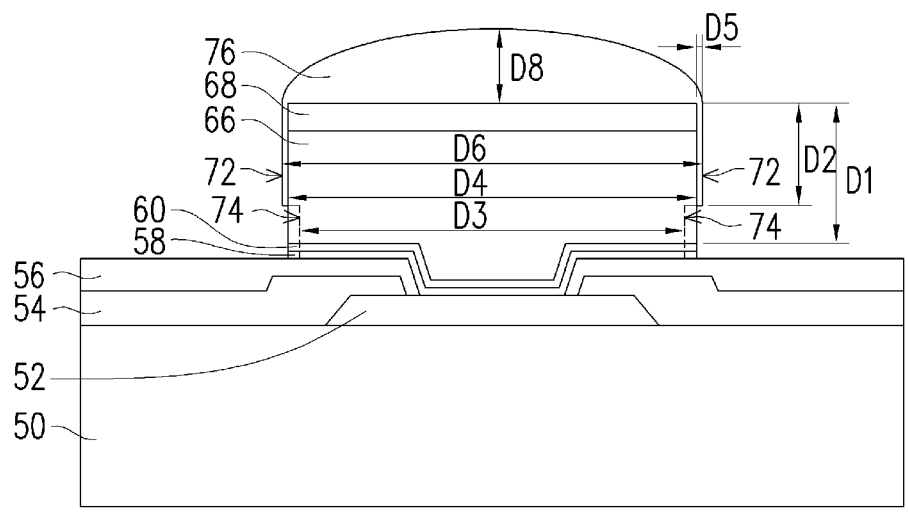
Figure 5:
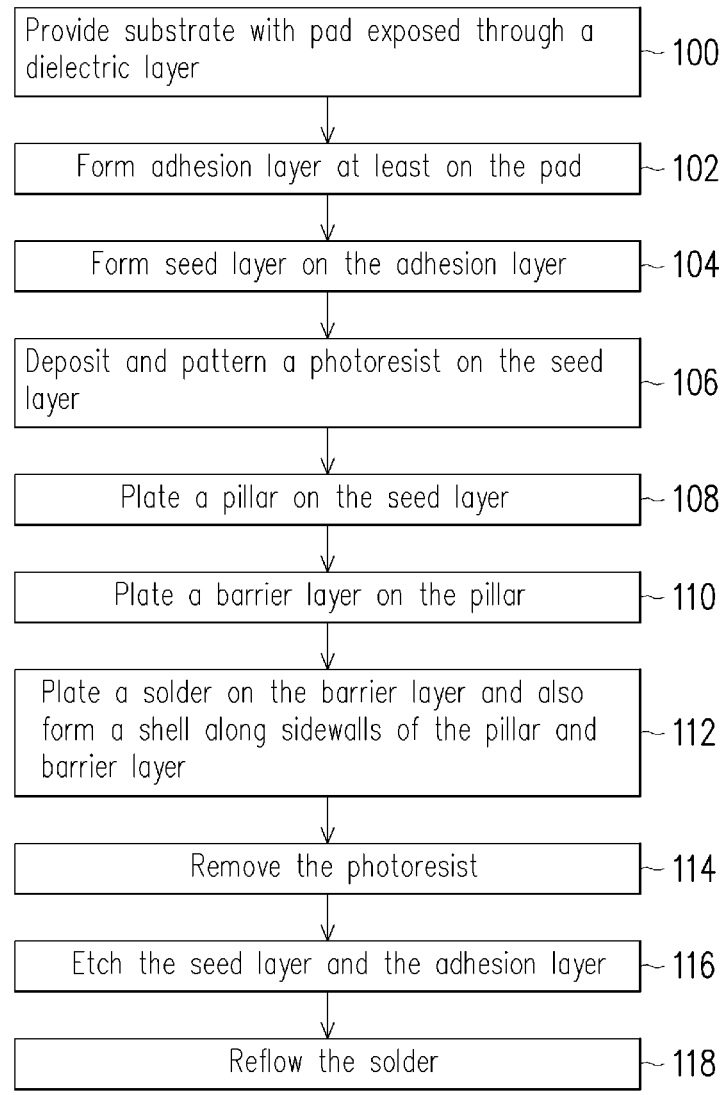
FIG. 5 is a flow chart of the manufacturing of the conductive external connector in accordance with some embodiments.

FIGS. 1 through 4 illustrate cross-sectional views of intermediate steps in the manufacturing of a conductive external connector in accordance with some embodiments, and FIG. 5 is a flow chart of the manufacturing of the conductive external connector in accordance with some embodiments. The steps of FIG. 5 will be discussed in the context of the cross-sectional views of FIGS. 1 through 4. The conductive external connector described in the context of the following illustrated embodiment is a metal pillar with solder on the metal pillar. Other embodiments can include different pillar structures, different materials, or the like.

In FIG. 1 and in step 100 of FIG. 5, a substrate 50 with a conductive pad 52 exposed through one or more dielectric layer 54 and 56 is provided. In the illustrated embodiment, the substrate 50 is an integrated circuit die, which may further be a part of a wafer (e.g., before singulation). The substrate 50 can include a semiconductor substrate, such as a bulk semiconductor substrate, a semiconductor-on-insulator (SOI) substrate, a multi-layered or gradient substrate, or the like. The semiconductor of the semiconductor substrate may include any semiconductor material, such as elemental semiconductor like silicon, germanium, or the like; a compound or alloy semiconductor; the like; or a combination thereof. The semiconductor substrate may further be a wafer, for example, which may further be a bulk silicon wafer. Devices, such as transistors, diodes, capacitors, resistors, etc., may be formed in and/or on the semiconductor substrate, and may be interconnected by interconnect structures formed by, for example, metallization patterns in one or more dielectric layers on the semiconductor substrate to form the integrated circuit of the integrated circuit die.

A conductive pad 52 is on the substrate 50. The conductive pad 52 may be formed over and in electrical contact with the interconnect structure in the substrate 50 in order to provide an external connection to the integrated circuit of the integrated circuit die. The conductive pad 52 may be on what may be referred to as an active side of the substrate 50 (or integrated circuit die). In some embodiments, the conductive pad 52 may be formed on, for example, a surface of an uppermost dielectric layer of the substrate 50. The conductive pad 52 may include a thin seed layer with a conductive material over the seed layer. The seed layer can include copper, titanium, nickel, gold, tin, the like, or a combination thereof deposited by Physical Vapor Deposition (PVD) or the like. The conductive material of the conductive pad 52 may be aluminum, copper, tungsten, silver, gold, tin, the like, or a combination thereof deposited by an electro-chemical plating process, Chemical Vapor Deposition (CVD), PVD, Atomic Layer Deposition (ALD), the like, or a combination thereof.

A first dielectric layer 54 is formed on the substrate 50 and over the conductive pad 52 as illustrated in FIG. 1. The first dielectric layer 54 (e.g., a passivation layer) may be one or more suitable dielectric materials such as silicon oxide, silicon nitride, low-k dielectrics such as carbon doped oxides, or the like deposited by CVD, PVD, ALD, a spin-on-dielectric process, the like, or a combination thereof. An opening is formed through the first dielectric layer 54 to expose a portion of the conductive pad 52. The opening may be formed by, for example, etching, milling, a laser technique, the like, or a combination thereof.

A second dielectric layer 56 is then formed on the first dielectric layer 54 and over the conductive pad 52 as illustrated in FIG. 1. The second dielectric layer 56 may be one or more suitable dielectric material, such as a polymer like polyimide, polybenzoxazole (PBO), benzocyclobutene (BCB), the like, or a combination thereof. The second dielectric layer 56 may be formed through a process such as a spin-on-dielectric process, a lamination process, the like, or a combination thereof. An opening is formed through the second dielectric layer 56 and through the opening in the first dielectric layer 54 to expose a portion of the conductive pad 52. The opening may be formed by, for example, etching, milling, laser techniques, exposing the second dielectric layer 56 to light when the second dielectric layer 56 is photo-sensitive, the like, or a combination thereof.

An Under Bump Metallurgy (UBM) is then formed on the second dielectric layer 56, along surfaces of the opening through the second dielectric layer 56, and on the exposed portion of the conductive pad 52. In some embodiments, the UBM is a metal layer, which may be a single layer or a composite layer comprising a plurality of sub-layers formed of different materials, and may be deposited using PVD or the like.

In the illustrated embodiment and in step 102 of FIG. 5, the formation of the UBM includes forming an adhesion layer 58 at least on the conductive pad 52. The adhesion layer 58 is formed on the second dielectric layer 56, along surfaces of the opening through the second dielectric layer 56, and on the exposed portion of the conductive pad 52, as illustrated in FIG. 1. The adhesion layer 58, in some embodiments, is titanium (Ti), titanium tungsten (TiW), or the like deposited by PVD or the like.

Further in the illustrated embodiment and in step 104 of FIG. 5, the formation of the UBM further includes forming a seed layer 60 on the adhesion layer 58. The seed layer 60, in some embodiments, is copper (Cu) or the like deposited by PVD or the like.

Then in FIG. 1 and in step 106 of FIG. 5, a photoresist 62 is deposited and patterned on the UBM (e.g., on the seed layer 60) as a mask. The photoresist 62 may be formed by spin coating or the like and may be exposed to light for patterning. The pattern of the photoresist 62 corresponds to a pattern of the conductive external connector that will be formed. The patterning forms an opening 64 through the photoresist 62 to expose the UBM (e.g., the seed layer 60).

Figure 2:
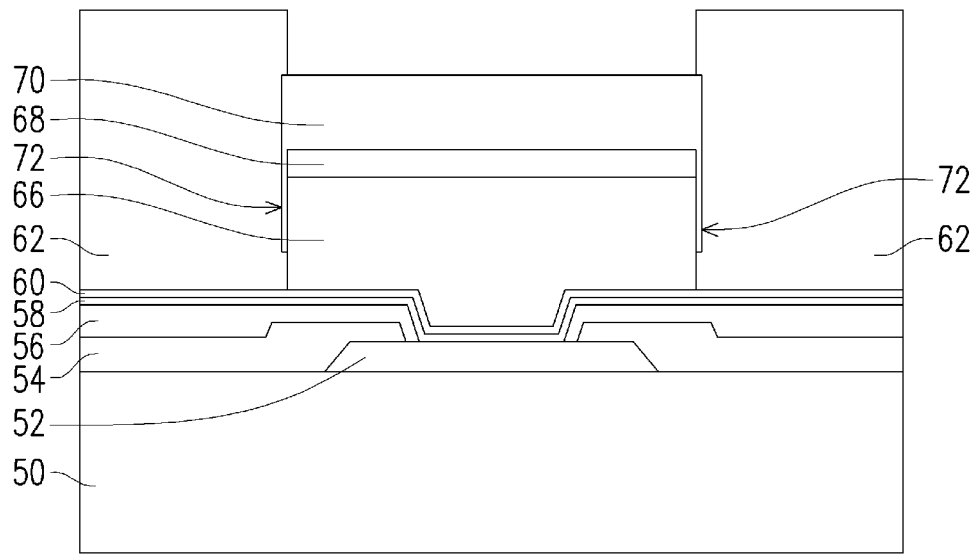

In FIG. 2 and in step 108 of FIG. 5, a pillar 66 of the conductive external connector is plated on the UBM (e.g., the seed layer 60) in the opening 64 of the photoresist 62. In some embodiments, the pillar 66 is a metal pillar, which may be copper (Cu), aluminum (Al), nickel (Ni), gold (Au), silver (Ag), palladium (Pd), the like, or a combination thereof. Additional details of the plating process of step 108 are discussed in further detail with respect to FIGS. 6 through 12.

Further in FIG. 2 and in step 110 of FIG. 5, optionally, a barrier layer 68 of the conductive external connector is plated on the pillar 66 in the opening 64 of the photoresist 62. In some embodiments, the barrier layer 68 is a metal layer, which, for example, may reduce or inhibit a reaction between solder and the pillar 66 that can form an intermetallic compound (IMC). In some embodiments, such as when the pillar 66 is copper, the barrier layer 68 is nickel (Ni) or the like. Additional details of the plating process of step 110 are discussed in further detail with respect to FIGS. 6 through 12. The barrier layer 68 can be omitted in some embodiments.

Further in FIG. 2 and in step 112 of FIG. 5, solder 70 of the conductive external connector is plated on the barrier layer 68 in the opening 64 of the photoresist 62. In some embodiments, the solder 70 is a tin-containing solder, such as having a composition including tin and silver, or the like. The solder 70 may be a lead-free solder material. In some embodiments, the solder 70 has a composition of tin and silver, where the tin is in a range from about 97.7% to about 98.5% of the solder composition, and silver is in a range from about 1.5% to about 2.3% of the solder composition. In some embodiments, the composition of the solder 70 can vary throughout a thickness of the solder 70, such as because of different plating speeds of different elements.

By plating the solder 70 in accordance with some embodiments, as will be discussed in further detail with respect to FIGS. 6 through 12, a shell 72 is formed along sidewalls of the barrier layer 68 and/or pillar 66. The shell 72 can be a tin-containing material. In some embodiments, the shell 72 has a composition of tin and silver, where the tin is in a range from about 97.7% to about 98.5% of the shell composition, and silver is in a range from about 1.5% to about 2.3% of the shell composition. In some embodiments, a composition of the shell 72 may have a slightly higher percentage of silver than the composition of the solder 70, such as because silver can plate to the sidewall of the pillar 66 at a higher rate, such as when the pillar 66 is copper.

In FIG. 3 and in step 114, the photoresist 62 is removed. The photoresist 62 can be removed by using any acceptable ashing or stripping process, such as an oxygen plasma ashing, or the like.

Further in FIG. 3 and in step 116, the UBM (e.g., the seed layer 60 and the adhesion layer 58) is etched to remove portions of the UBM that do not underlie the pillar 66. After removal of the photoresist 62, a portion of the seed layer 60 that is not underlying the pillar 66 will be exposed. This exposed portion of the seed layer 60 and a corresponding underlying portion of the adhesion layer 58 are etched using an appropriate etch process. For example, a wet etch selective to materials of the seed layer 60 and the adhesion layer 58, such as a hydrochloric acid (HCl) etch, can be used.

As shown in FIG. 3, the sidewall of the barrier layer 68 and pillar 66 can have a first dimension D1 (e.g., a height) from a top surface of the UBM (e.g., the seed layer 60) to a top surface of the barrier layer 68. Further, the shell 72 extends a second dimension D2 from the top surface of the barrier layer 68 and along the sidewall of the barrier layer 68 and pillar 66. The second dimension D2 can be in a range from about 5% to about 100% of the first dimension D1, such as in a range from about 5% to about 10% of the first dimension D1. The shell 72 extends from the top surface of the barrier layer 68 a distance below an interface between the barrier layer 68 and the pillar 66. In some examples, the first dimension D1 is in a range from about 40 μm to about 70 μm, and the second dimension D2 is in a range from about 1 μm to about 15 μm.

In some embodiments, at least a portion of the UBM (e.g., the seed layer 60) and the pillar 66 are the same materials, for example, copper. In these embodiments, the etch process to remove exposed portions of the UBM can also etch exposed portions of the pillar 66 below the shell 72. This etching of the pillar 66 can result in an undercut portion 74 (identified by the dashed line) of the pillar 66 below the shell 72 being removed. During the etching, the shell 72 can protect the pillar 66 from being etched where the shell 72 covers the pillar 66. Accordingly, a lower portion of the pillar 66 can have a third dimension D3 (e.g., width) that is smaller than a fourth dimension D4 (e.g., width) of an upper portion of the pillar 66. In other embodiments, the pillar 66 is not etched during the etching of the UBM. In some examples, the third dimension D3 is in a range from about 38 μm to about 68 μm, and the fourth dimension D4 is in a range from about 40 μm to about 70 μm.

As further shown in FIG. 3, the shell 72 can have a fifth dimension D5 (e.g., a thickness) along the sidewalls of the barrier layer 68 and/or pillar 66. A sixth dimension D6 is from an exterior surface of the shell 72 of a first side of the external conductive connector to another exterior surface of the shell 72 of a second, opposite side of the external conductive connector. A seventh dimension D7 is a height of the solder 70, which may be substantially uniform throughout the solder 70. The fifth dimension D5 can be less than, such as substantially less than, the seventh dimension D7. For example, the fifth dimension D5 can in a range from 1% to about 7% of the seventh dimension D7. In some examples, the fifth dimension D5 is equal to or less than about 1 μm; the sixth dimension D6 is in a range from about 25 μm to about 90 μm; and the seventh dimension D7 is in a range from about 10 μm to about 28 μm.

In FIG. 4 and in step 118 of FIG. 5, the solder 70 is reflowed to form reflowed solder 76. The reflow can be performed at any temperature capable of adequately melting the solder 70, such as, for example, equal to or greater than 240° C. Surface tension of the solder 70 while melted during the reflow step can cause the outer surface of the reflowed solder 76 to be rounded. In some embodiments, the shell 72 can be reflowed during the reflow process and still remain on sidewalls of the barrier layer 68 and/or pillar 66. In some embodiments where the solder 70 and the shell 72 have a composition of tin and silver, the percentage of silver in each can decrease as a result of the reflow process. For example, silver can more readily diffuse into the barrier layer 68 and/or pillar 66. As an example, when the solder 70 and shell 72 have a composition of about 97.7% to about 98.5% of tin and about 1.5% to about 2.3% of silver before the reflow, after the reflow the reflowed solder 76 and shell 72 can have a composition of about 97.8% to about 98.6% of tin and about 1.4% to about 2.2% of silver. In still further embodiments, the reflow process may cause an intermetallic compound (IMC) to be formed in the reflowed solder 76 and the shell 72. The IMC can be a material formed by a reaction between the material of the solder 70 and the shell 72 and the material(s) of the barrier layer 68 and/or pillar 66. For example, an IMC in the shell 72 can be a tin-copper alloy and/or a tin-nickel alloy when the shell 72 is tin-silver, the pillar 66 is copper, and the barrier layer 68 is nickel. The IMC in the shell 72 can have a thickness from the sidewall of the pillar 66 that is equal to or greater than about half of the fifth dimension D5.

An eighth dimension D8 is a largest height of the reflowed solder 76. The fifth dimension D5 can be less than, such as substantially less than, the eighth dimension D8. For example, the fifth dimension D5 can in a range from 1% to about 5% of the eighth dimension D8. In some examples, the eighth dimension D8 is in a range from about 15 μm to about 40 μm.

Although not specifically illustrated, the structure of FIG. 4 may further be bonded to another package component, such as another integrated circuit die, package substrate, or the like. The other package component may include a bond pad to which the reflowed solder 76 is attached through reflowing the reflowed solder 76. A dimension between the barrier layer 68 (or the pillar 66 when the barrier layer 68 is omitted) and the bond pad of the other package component can be greater than, such as substantially greater than, the fifth dimension D5 of the shell 72.

Figure 6:
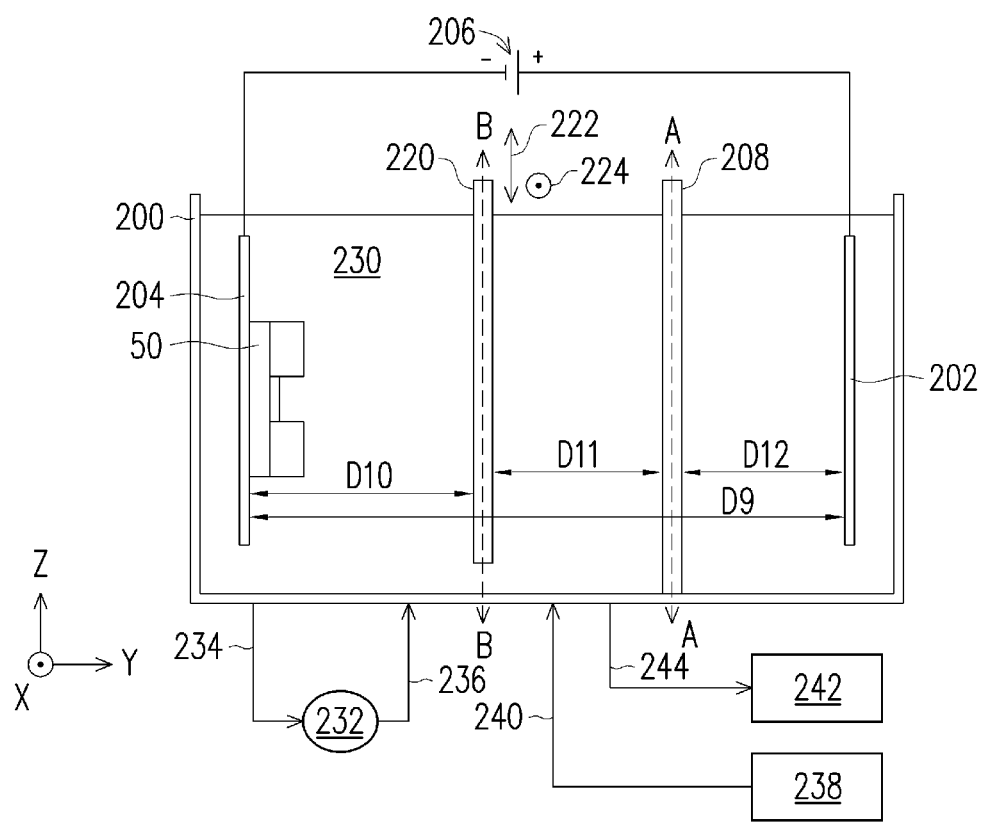
FIG. 6 is a simplified diagram of a plating system used in accordance with some embodiments.

FIG. 6 is a simplified diagram of a plating system used in accordance with some embodiments. In some embodiments and in some plating steps, the plating system may be an EBARA Model UFP-A from EBARA Corporation headquartered in Tokyo, Japan. In other embodiments and/or in other plating steps, the plating system may be a NEXX Model Stratus 300 from TEL NEXX, Inc. headquartered in the United States.

The plating system includes a tank 200, an anode 202, a substrate holder 204, a shielding plate 208, and a paddle 220. In operation, a plating solution 230 is in the tank 200, and the substrate holder 204 (with the substrate 50) and the anode 202 are immersed in the plating solution 230. Further, a power supply 206 is coupled between the anode 202 and the substrate holder 204 such that a current can flow through the plating solution 230 between the anode 202 and the substrate 50 to cause a material to be plated on the substrate 50. The shielding plate 208 is disposed in the tank 200 between the anode 202 and the substrate holder 204 and can shield an extraneous electric field to allow plating to be more uniform on the substrate 50. The paddle 220 can agitate the plating solution 230 to, at least in part, mix the plating solution 230 to be more uniform in composition as the plating solution 230 is depleted by the plating process. The agitation by the paddle 220 may be caused by reciprocating the paddle 220 in direction 222, which is perpendicular to the top surface of the plating solution 230 (e.g., in a Z-direction), or in direction 224, which is parallel to the top surface of the plating solution 230 and intersects a flow of electrical current between the anode 202 and the substrate holder 204 (e.g., in an X-direction), in this example. A ninth dimension D9 is between the anode 202 and the substrate holder 204. A tenth dimension D10 is between the substrate holder 204 and the paddle 220. An eleventh dimension D11 is between the shielding plate 208 and the paddle 220. A twelfth dimension D12 is between the shielding plate 208 and the anode 202. These dimensions can remain the same or similar between plating steps or can be varied between plating steps, as will be discussed subsequently.

The plating system further includes a circulation unit that includes a pump 232 with an outlet 234 from the tank 200 and an inlet 236 to the tank 200. The circulation unit can circulate the plating solution 230 in the tank 200 to, at least in part, mix the plating solution 230 during the plating process. The plating system also includes a replenishing reservoir 238 with inlet 240 to the tank 200 and a depleted-solution reservoir 242 with outlet 244 from the tank 200. The replenishing reservoir 238 can contain a fresh, un-depleted source of the plating solution 230. The depleted-solution reservoir 242 can contain used, depleted plating solution 230. The depleted-solution reservoir 242 can remove plating solution 230 from the tank 200 via outlet 244, and the replenishing reservoir 238 can add new plating solution 230 to the tank 200 via inlet 240.

Figure 7:
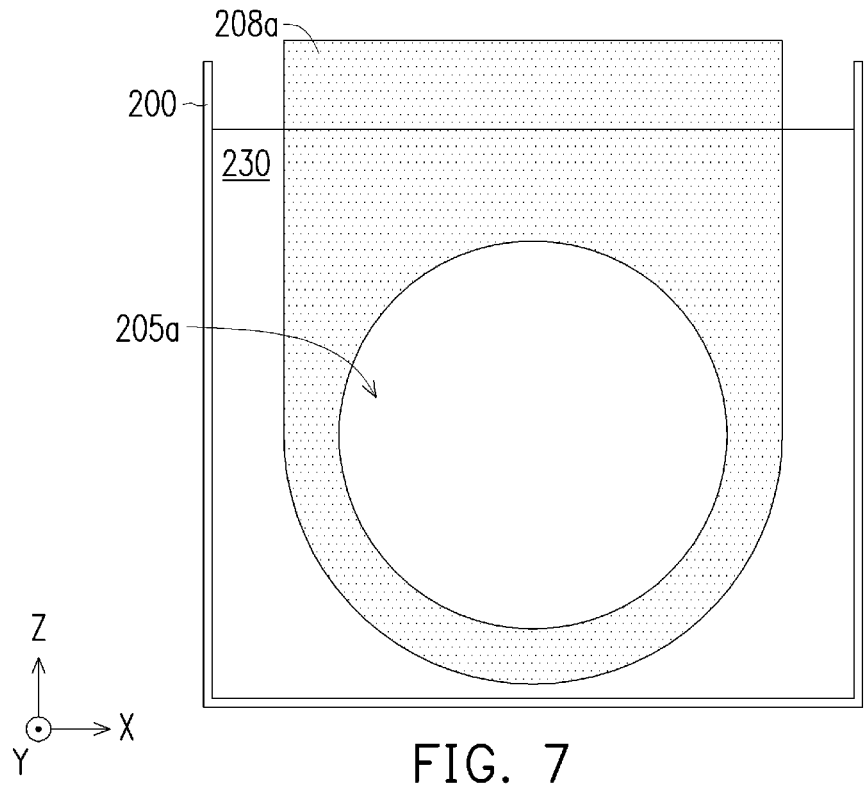
FIG. 7 is a cross-sectional view of a first example shielding plate in the plating system of FIG. 6 in accordance with some embodiments.
Figure 8:
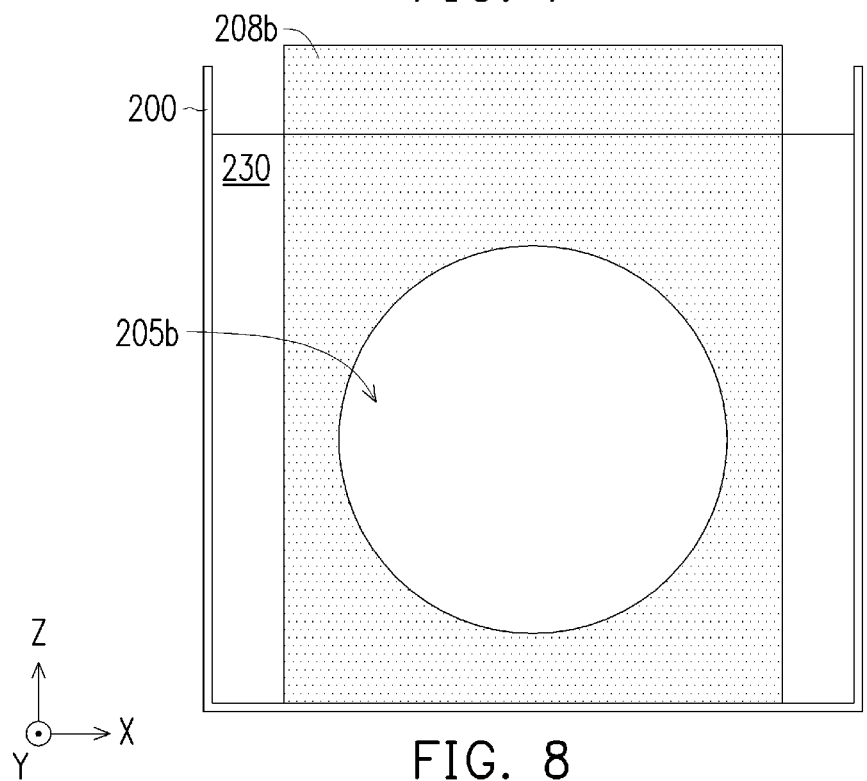
FIG. 8 is a cross-sectional view of a second example shielding plate in the plating system of FIG. 6 in accordance with some embodiments.
Figure 9:
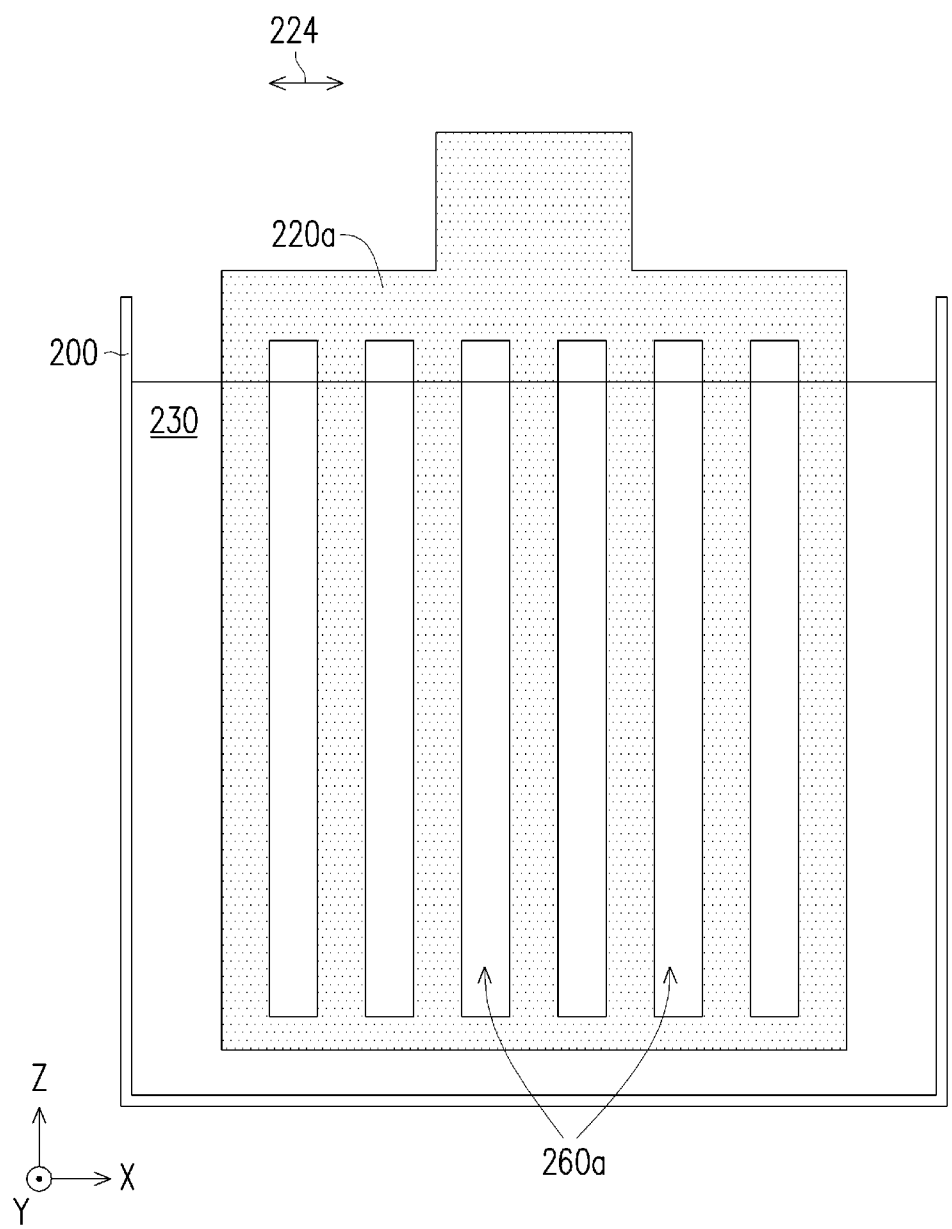
FIG. 9 is a cross-sectional view of an example paddle in the plating system of FIG. 6 in accordance with some embodiments.

FIGS. 7 through 9 illustrate additional details of a plating system, such as an EBARA Model UFP-A. FIGS. 7 and 8 illustrate different example shielding plates 208a and 208b, respectively, along the cross-section A-A in FIG. 6. The shielding plates 208a and 208b can be a dielectric material, such as polyvinyl chloride (PVC) or the like. The shielding plates 208a and 208b have an opening 250a and 205b, respectively. Each of the openings 250a and 250b can have a diameter that is less than a diameter of the substrate 50 (e.g., wafer) on the substrate holder 204. FIG. 9 illustrates an example paddle 220a along the cross-section B-B in FIG. 6. The paddle 220a can be a metal, such as titanium, coated with Teflon, or the like. The paddle 220a, as illustrated, is a rectangular shape having vertical slits 260a (e.g., extending along a Z-direction). In some embodiments, the paddle 220a oscillates in direction 224.

Figure 10:
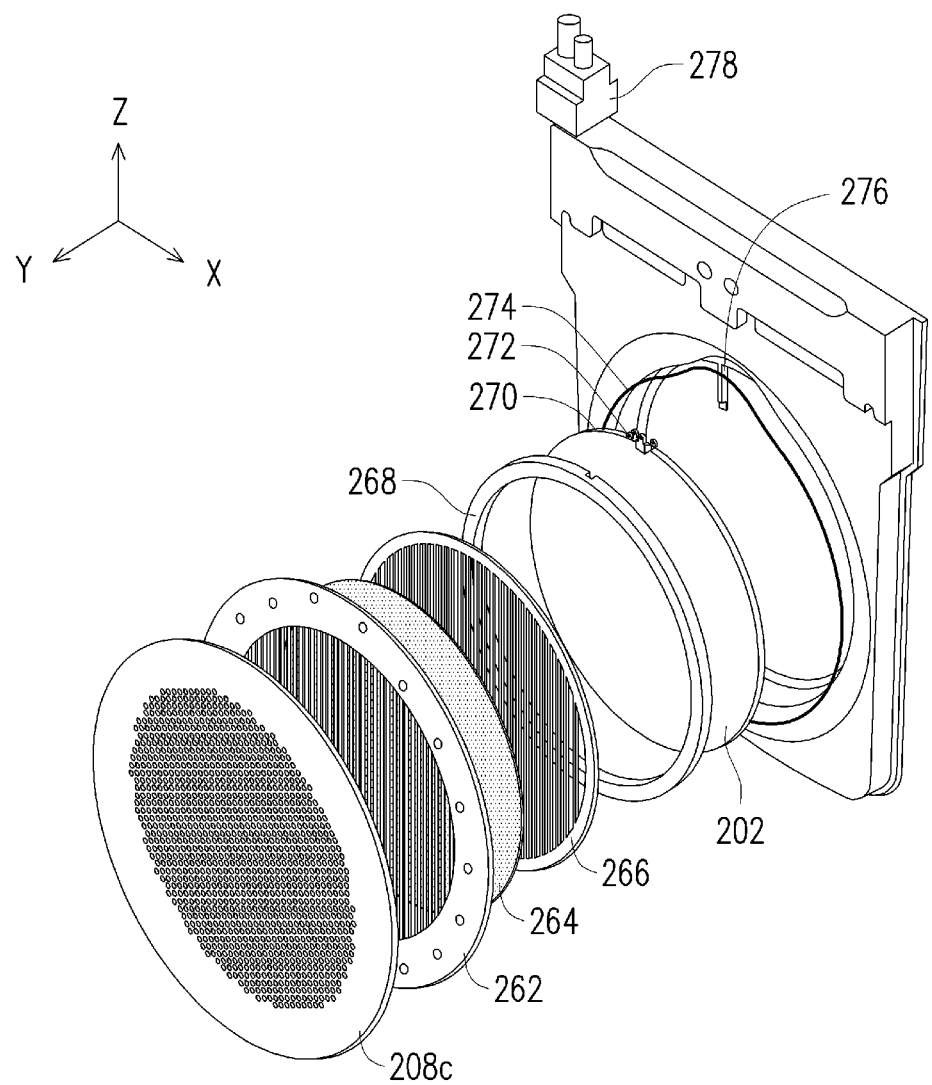
FIG. 10 is an exploded perspective view of an anode module that includes an example shielding plate in the plating system of FIG. 6 in accordance with some embodiments.
Figure 11:
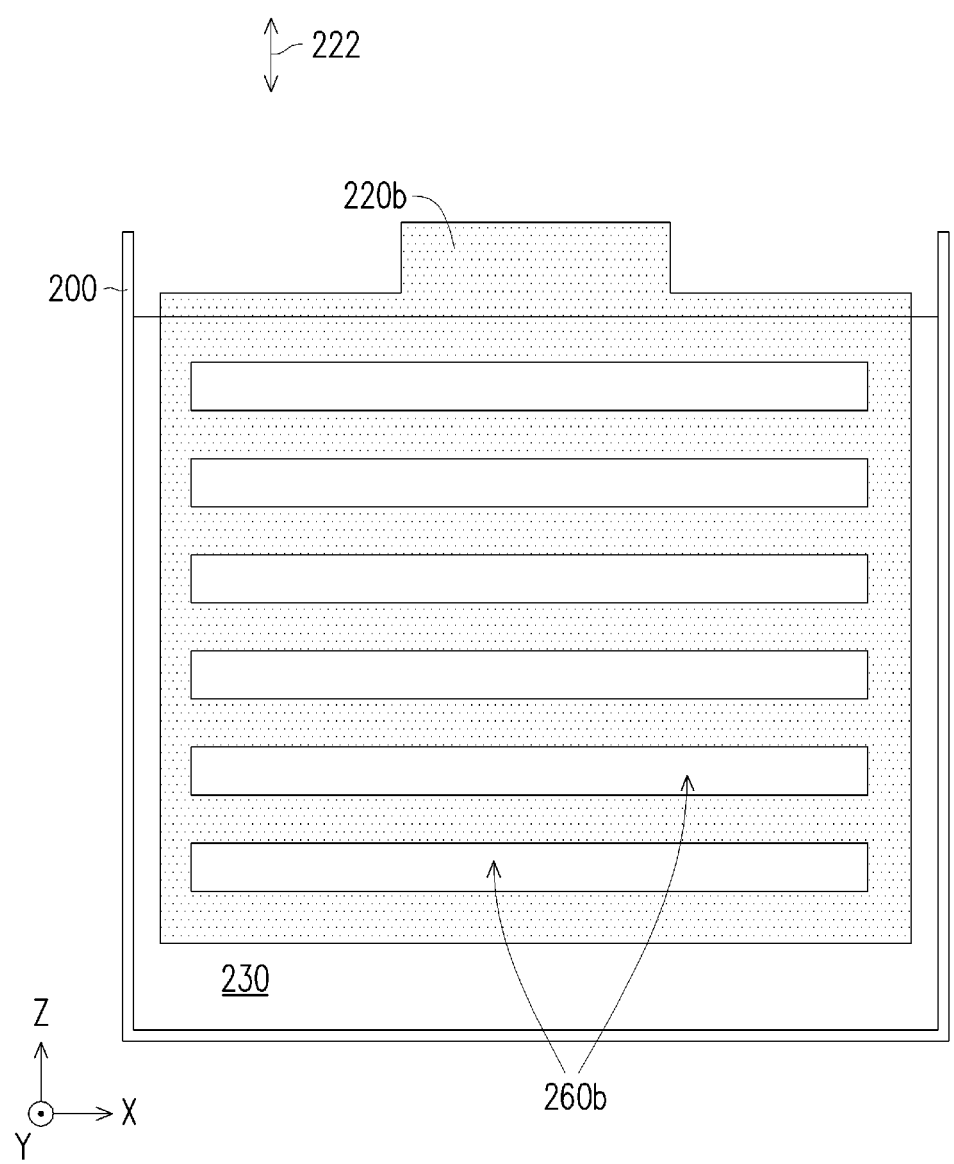
FIG. 11 is a cross-sectional view of an example paddle in the plating system of FIG. 6 in accordance with some embodiments.

FIGS. 10 and 11 illustrate additional details of another plating system, such as a NEXX Model Stratus 300. FIG. 10 illustrates an exploded perspective view of an anode module that includes a shielding plate 208c. The anode module includes, in order along the Y-direction, the shielding plate 208c, an outer membrane support 262, a membrane 264, an inner membrane support 266, an anode boot 268, the anode 202 with a clamp band around the anode 270, a tensioner 272, an O ring 274, and an anode lead rod 276. The anode module further includes an input block 278 at a top of the module. FIG. 11 illustrates an example paddle 220b along the cross-section B-B in FIG. 6. The paddle 220b can be a metal, such as titanium, coated with Teflon, or the like. The paddle 220b, as illustrated, is a rectangular shape having horizontal slits 260n (e.g., extending along an X-direction). In some embodiments, the paddle 220b oscillates in direction 222.

Figure 12:
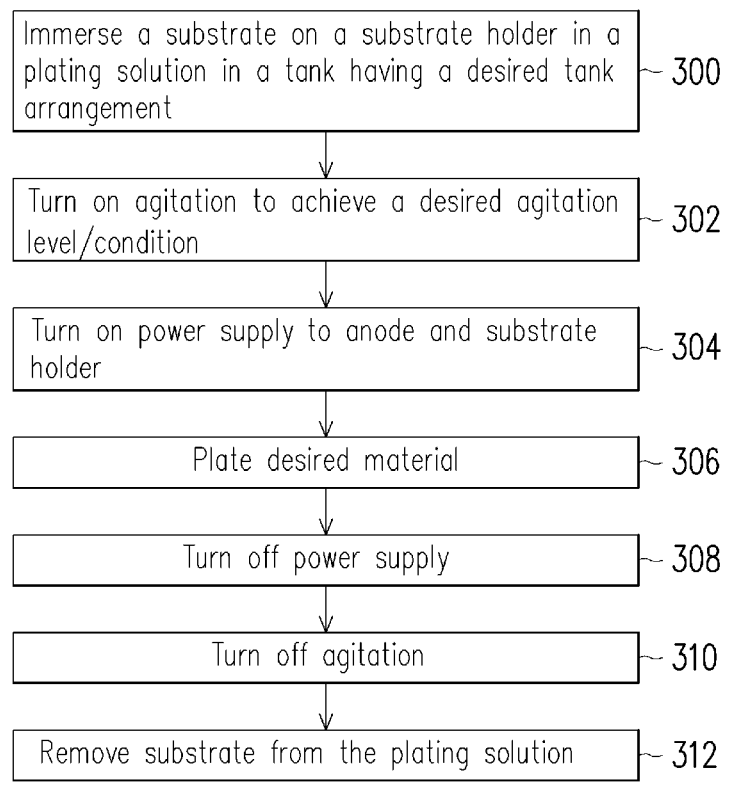
FIG. 12 is a flow chart for plating in accordance with some embodiments.

FIG. 12 illustrates a process flow for plating in accordance with some embodiments. The generic process of FIG. 12 will be discussed first, and then, implementations of the generic process of FIG. 12 as implemented as each of steps 108, 110, and 112 of FIG. 5 will be discussed. Further, the operation of FIG. 12 will be discussed in the context of the plating system(s) of FIG. 6.

In step 300, a substrate 50 on a substrate holder 204 is immersed into a plating solution 230 in a tank 200 having a desired tank arrangement. In step 302, agitation is turned on to achieve a desired agitation level and/or condition affected at the substrate 50 on the substrate holder 204. The agitation level and/or condition affected at the substrate 50, in some examples, is caused by the paddle 220 reciprocating in direction 222 and/or 224 and/or in conjunction with the tank arrangement. In step 304, a power supply 206 is turned on to an anode 202 and substrate holder 204. In step 306, a desired material is plated on the substrate 50, which is caused by electrical current flowing through the plating solution 230. Once a desired structure is achieved by plating the material, in step 308, the power supply 206 is turned off, and the agitation is turned off in step 310. Further, in step 312, the substrate 50 is removed from the plating solution 230.

In a first implementation embodiment of FIG. 5, generally, one or more plating system(s) that is used for the plating steps 108, 110, and 112 have a same or similar arrangement or configuration. A same plating system can be used for all of the plating steps 108, 110, and 112, or a different plating system can be used for each of the plating steps 108, 110, and 112. In this first implementation embodiment, an EBARA Model UFP-A is used for each of the plating steps 108, 110, and 112. For example, in this first implementation embodiment, the dimensions of the plating system, as shown in FIG. 6, used during each of steps 108, 110, and 112 can be as follows: the ninth dimension D9 may be about 90 mm; the tenth dimension D10 may be in a range from about 19 mm to about 20 mm, such as about 19 mm; the eleventh dimension D11 may be in a range from about 19 mm to about 20 mm, such as about 19 mm; and the twelfth dimension D12 may be in a range from about 50 mm to about 52 mm, such as about 52 mm.

Generally, in this first implementation embodiment, the desired agitation level and/or condition affected at the substrate 50 during plating step 112 is greater than the desired agitation level and/or condition affected at the substrate 50 during plating steps 108 and/or 110. Generally, in this first implementation embodiment, this greater agitation level and/or condition during plating step 112 is caused by having an increased frequency of reciprocation of the paddle 220 during step 112 than during steps 108 and/or 110. In some other embodiments, the greater agitation level and/or condition during plating step 112 can be caused by having an increased magnitude of reciprocation of the paddle 220, with or without an increased frequency, during step 112 than during steps 108 and/or 110.

According to step 108 of FIG. 5, the substrate 50 is immersed (step 300) in a plating solution 230 in a tank 200 to plate the pillar 66. A copper(II) sulfate ($CuSO_4$) base copper solution, such as available from BASF SE, with a copper additive, such as available from Enthone, Inc., can be used as the plating solution 230 in step 108 when the pillar 66 is to be a copper pillar in accordance with some embodiments. The agitation is turned on (step 302), and the desired agitation level affected at the substrate 50 is a low agitation level that can be achieved by turning on the paddle 220 to reciprocate in direction 224 at a frequency of equal to or less than 300 revolutions per minute (RPM), for example. A magnitude of the reciprocation in direction 224 of the paddle 220 can be in a range from about 50 mm to about 100 mm, such as about 80 mm. Under these conditions, the power supply 206 is turned on (step 304), and copper is plated (step 306) on the substrate 50 to form a pillar 66 of copper, as illustrated in FIGS. 2 through 4. Other materials, solutions, and parameters can be used, as one of ordinary skill in the art will readily understand. Once the desired material is plated (step 306) and the power and agitation are turned off (steps 308 and 310), the substrate 50 is removed from the plating solution 230 for the step 108 of FIG. 5.

According to optional step 110 of FIG. 5, the substrate 50 is then immersed (step 300) in a plating solution 230 in a tank 200, which may be a different tank (but may be in a same or similar configuration) from the tank used in the plating process of step 108, to plate the barrier layer 68 on the pillar 66. A nickel sulfaminate base nickel solution can be used as the plating solution 230 in step 110 when the barrier layer 68 is to be a nickel layer in accordance with some embodiments. The agitation is turned on (step 302), and the desired agitation level affected at the substrate 50 is a low agitation level that can be achieved by turning on the paddle 220 to reciprocate in direction 224 at a frequency of equal to or less than 300 RPM, for example. A magnitude of the reciprocation in direction 224 of the paddle 220 can be in a range from about 50 mm to about 100 mm, such as about 80 mm. The agitation conditions for step 110 may be the same as the agitation conditions used in step 108, and hence, the agitation levels affected at the substrate 50 for steps 110 and 108 may be the same. Under these conditions, the power supply 206 is turned on (step 304), and nickel is plated (step 306) on the pillar 66 to form a barrier layer 68 of nickel, as illustrated in FIGS. 2 through 4. Other materials, solutions, and parameters can be used, as one of ordinary skill in the art will readily understand. Once the desired material is plated (step 306) and the power and agitation are turned off (steps 308 and 310), the substrate 50 is removed from the plating solution 230 for the step 110 of FIG. 5. In other embodiments, step 110, and hence, the barrier layer 68, is omitted.

According to step 112 of FIG. 5, the substrate 50 is then immersed (step 300) in a plating solution 230 in a tank 200, which may be a different tank (but may be in a same or similar configuration) from the tanks used in the plating process of steps 108 and/or 110, to plate the solder 70 on the barrier layer 68 (or the pillar 66 when the barrier layer 68 is omitted). A tin/silver solution with a 202 series additive from Mitsubishi Materials Corporation can be used as the plating solution 230 in step 112 when the solder 70 is to have a tin-silver composition in accordance with some embodiments. The agitation is turned on (step 302), and the desired agitation level affected at the substrate 50 is a high agitation level that can be achieved by turning on the paddle 220 to reciprocate in direction 224 at a frequency of equal to or greater than 400 RPM, for example. A magnitude of the reciprocation in direction 224 of the paddle 220 can be in a range from about 50 mm to about 100 mm, such as about 80 mm. The agitation level affected at the substrate 50 in step 112 is greater than the agitation level affected at the substrate 50 in steps 108 and 110. Under these conditions, the power supply 206 is turned on (step 304), and solder 70 and shell 72 are plated (step 306) on the barrier layer 68 and/or pillar 66, as illustrated in FIGS. 2 through 4. Other materials, solutions, and parameters can be used, as one of ordinary skill in the art will readily understand. Once the desired material is plated (step 306) and the power and agitation are turned off (steps 308 and 310), the substrate 50 is removed from the plating solution 230 for the step 110 of FIG. 5.

In a second implementation embodiment of FIG. 5, generally, a plating system that is used for the plating step 112 has different arrangement or configuration from one or more plating system(s) that is used for the plating steps 108 and/or 110. A same plating system can be used for the plating steps 108 and 110, and a different plating system can be used for the plating step 112. A different plating system can be used for each of the plating steps 108, 110, and 112. In this second implementation embodiment, an EBARA Model UFP-A is used for each of the plating steps 108 and 110, and a NEXX Model Stratus 300 is used for the plating step 112. For example, in this second implementation embodiment, the dimensions of the plating systems, as shown in FIG. 6, used during steps 108 and 110 can be as follows: the ninth dimension D9 may be about 90 mm; the tenth dimension D10 may be in a range from about 19 mm to about 20 mm, such as about 19 mm; the eleventh dimension D11 may be in a range from about 19 mm to about 20 mm, such as about 19 mm; and the twelfth dimension D12 may be in a range from about 50 mm to about 52 mm, such as about 52 mm. Further, for example, in this second implementation embodiment, the dimensions of the plating systems, as shown in FIG. 6, used during step 112 can be as follows: the ninth dimension D9 may be about 41 mm; the tenth dimension D10 may be in a range from about 4 mm to about 6 mm, such as about 5 mm; the eleventh dimension D11 may be in a range from about 13 mm to about 23 mm, such as about 18 mm; and the twelfth dimension D12 may be in a range from about 13 mm to about 23 mm, such as about 18 mm.

Generally, in this second implementation embodiment, the desired agitation level and/or condition affected at the substrate 50 during plating step 112 is greater than the desired agitation level and/or condition affected at the substrate 50 during plating steps 108 and/or 110. Generally, in this second implementation embodiment, this greater agitation level and/or condition during plating step 112 is caused by having the paddle 220 closer to the substrate 50 and/or reciprocate in a different direction during step 112 than during steps 108 and/or 110.

According to step 108 of FIG. 5, the substrate 50 is immersed (step 300) in a plating solution 230 in a tank 200 to plate the pillar 66. The tank 200 in this step 108 can have the arrangement and configuration as discussed above with respect to step 108 of this second implementation embodiment. A copper(II) sulfate (CuSO$_4$) base copper solution, such as available from BASF SE, with a copper additive, such as available from Enthone, Inc., can be used as the plating solution 230 in step 108 when the pillar 66 is to be a copper pillar in accordance with some embodiments. The agitation is turned on (step 302), and the desired agitation level affected at the substrate 50 is a low agitation level that can be achieved by turning on the paddle 220 to reciprocate in direction 224 (e.g., parallel to the top surface of the plating solution 230 and intersecting the flow of current in the solution 230 in an X-direction) at a frequency, such as in a range from about 240 RPM to about 420 RPM, and more particularly, such as about 350 RPM, for example. A magnitude of the reciprocation in direction 224 of the paddle 220 can be in a range from about 290 mm to about 310 mm, such as about 300 mm. Under these conditions, the power supply 206 is turned on (step 304), and copper is plated (step 306) on the substrate 50 to form a pillar 66 of copper, as illustrated in FIGS. 2 through 4. Other materials, solutions, and parameters can be used, as one of ordinary skill in the art will readily understand. Once the desired material is plated (step 306) and the power and agitation are turned off (steps 308 and 310), the substrate 50 is removed from the plating solution 230 for the step 108 of FIG. 5.

According to optional step 110 of FIG. 5, the substrate 50 is then immersed (step 300) in a plating solution 230 in a tank 200, which may be a different tank (but may be in a same or similar configuration) from the tank used in the plating process of step 108, to plate the barrier layer 68 on the pillar 66. The tank 200 in this step 110 can have the arrangement and configuration as discussed above with respect to step 110 of this second implementation embodiment. A nickel sulfaminate base nickel solution can be used as the plating solution 230 in step 110 when the barrier layer 68 is to be a nickel layer in accordance with some embodiments. The agitation is turned on (step 302), and the desired agitation level affected at the substrate 50 is a low agitation level that can be achieved by turning on the paddle 220 to reciprocate in direction 224 (e.g., parallel to the top surface of the plating solution 230 and intersecting the flow of current in the solution 230 in an X-direction) at a frequency, such as in a range from about 240 RPM to about 420 RPM, and more particularly, such as about 300 RPM, for example. A magnitude of the reciprocation in direction 224 of the paddle 220 can be in a range from about 290 mm to about 310 mm, such as about 300 mm. The agitation conditions for step 110 may be the same as the agitation conditions used in step 108, and hence, the agitation levels affected at the substrate 50 for steps 110 and 108 may be the same. Under these conditions, the power supply 206 is turned on (step 304), and nickel is plated (step 306) on the pillar 66 to form a barrier layer 68 of nickel, as illustrated in FIGS. 2 through 4. Other materials, solutions, and parameters can be used, as one of ordinary skill in the art will readily understand. Once the desired material is plated (step 306) and the power and agitation are turned off (steps 308 and 310), the substrate 50 is removed from the plating solution 230 for the step 110 of FIG. 5. In other embodiments, step 110, and hence, the barrier layer 68, is omitted.

According to step 112 of FIG. 5, the substrate 50 is then immersed (step 300) in a plating solution 230 in a tank 200, which may be a different tank (and has a different configuration) from the tanks used in the plating process of steps 108 and/or 110, to plate the solder 70 on the barrier layer 68 (or the pillar 66 when the barrier layer 68 is omitted). The tank 200 in this step 112 can have the arrangement and configuration as discussed above with respect to step 112 of this second implementation embodiment. The dimensions D9, D10, D11, and D12 of the tank 200 used for step 112 are less than the dimensions D9, D10, D11, and D12, respectively, of the tank 200 used for step(s) 108 and/or 110. A tin/silver solution with a 202 series additive from Mitsubishi Materials Corporation can be used as the plating solution 230 in step 112 when the solder 70 is to have a tin-silver composition in accordance with some embodiments. The agitation is turned on (step 302), and the desired agitation level affected at the substrate 50 is a high agitation level that can be achieved by turning on the paddle 220 to reciprocate in direction 222 (e.g., perpendicular to the top surface of the plating solution 230 in a Z-direction) at a frequency, such as in a range from about 240 RPM to about 420 RPM, and more particularly, such as about 300 RPM, for example. The direction 224 of the reciprocation of the paddle 220 in the tank 200 used for step 112 is different from the direction 222 of the reciprocation of the paddle 220 in the tank 200 used for step(s) 108 and/or 110. The frequency of the reciprocation in steps 108, 110, and 112 can be equal. A magnitude of the reciprocation in direction 224 of the paddle 220 can be in a range from about 50 mm to about 200 mm, such as about 150 mm. The magnitude of the reciprocation in steps 108, 110, and 112 can be equal. The agitation conditions for step 112 may cause greater agitation affected at the substrate 50 than the agitation caused by the conditions used in steps 108 and/or 110. Under these conditions, the power supply 206 is turned on (step 304), and solder 70 and shell 72 are plated (step 306) on the barrier layer 68 and/or pillar 66, as illustrated in FIGS. 2 through 4. Other materials, solutions, and parameters can be used, as one of ordinary skill in the art will readily understand. Once the desired material is plated (step 306) and the power and agitation are turned off (steps 308 and 310), the substrate 50 is removed from the plating solution 230 for the step 110 of FIG. 5.

Although discussed in different implementation embodiments above, other embodiments contemplate an increased agitation level affected at the substrate 50 during step 112 relative to that in steps 108 and/or 110 using an combination of features discussed above, such as any combination of two or more of increase reciprocation frequency, increased reciprocation magnitude, closer proximity of components, and different reciprocation direction, or other parameter or factor that can affect an increased agitation level.

By increasing the agitation level affected at the substrate 50 in step 112, the photoresist 62 that is used during step 112 can flex or bend to create a gap between the photoresist 62 and the pillar 66 and/or barrier layer 68 during the plating (step 306) to allow the formation of the shell 72. A desired second dimension D2 that the shell 72 extends along a sidewall can be achieved by a dwell time during the plating in step 112. For example, a small dwell time can result in a small dimension D2, and a longer dwell time, such as 120 seconds, can result in a dimension D2 that nears the dimension D1.

The shell 72 can protect the barrier layer 68 and/or pillar 66 during a subsequent etch step, such as step 116 of FIG. 5 where the seed layer 60 and the adhesion layer 58 are etched, to prevent the surface on which the solder 70 is plated from being etched away. Hence, the surface underlying the solder 70 can remain supporting the solder 70 during a subsequent reflow process, and the solder 70 can be less prone to collapsing down on a sidewall of the pillar 66, for example. This can, in some embodiments, allow for higher density layouts of external conductive connectors that include a pillar with solder. Further, the shell 72 can protect the pillar 66 and/or barrier layer 68 from oxidizing due to subsequent processing. Also, the shell 72 can protect an interface between the pillar 66 and the barrier layer 68 from moisture that could otherwise penetrate in the interface. Hence, the shell 72 can increase the reliability of the structure.

An embodiment is a method. The method includes forming an external electrical connector structure on a substrate. The forming the external electrical connector structure includes plating a pillar on the substrate at a first agitation level affected at the substrate in a first solution. The method further includes plating solder on the external electrical connector structure at a second agitation level affected at the substrate in a second solution. The second agitation level affected at the substrate is greater than the first agitation level affected at the substrate. The plating the solder further forms a shell on a sidewall of the external electrical connector structure.

Another embodiment is a method. A pillar is plated on a substrate using a first plating system. The pillar is at least a part of an external electrical connector structure. The first plating system comprises a first paddle, and the first paddle is reciprocated at a first frequency in a first plating solution during the plating the pillar. Solder is plated on the external electrical connector structure using a second plating system. The second plating system comprises a second paddle, and the second paddle is reciprocated at a second frequency in a second plating solution during the plating the solder. The second frequency is greater than the first frequency. The plating the solder further forms a shell along a sidewall of the external electrical connector structure.

Another embodiment is a semiconductor device. A semiconductor device comprises a conductive pillar located over a conductive member over a substrate. A reflowable material is located over the conductive pillar, wherein the reflowable material further comprises a first portion located over a first surface of the conductive pillar, wherein the first surface faces away from the conductive member, wherein the first portion has a first concentration of a first component. The reflowable material also comprises a second portion located adjacent to but not fully covering a second surface of the conductive pillar, wherein the second surface extends from the first surface towards the substrate, wherein the second portion has a second concentration of the first component greater than the first concentration.

A further embodiment is a method. An under bump metallurgy (UBM) is formed on a substrate. A mask is formed on the UBM, and an opening through the mask exposes a portion of the UBM. A pillar is plated on the UBM in the opening through the mask, and the pillar is part of an external electrical connector. A solder is plated on the external electrical connector. The plating the solder further comprises causing the mask to flex causing a gap between the mask and a sidewall of the external electrical connector. A shell is formed along the sidewall of the external electrical connector and between the mask and the sidewall of the external electrical connector in the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a conductive pillar located over a conductive member over a substrate;
   a reflowable material located over the conductive pillar, wherein the reflowable material further comprises:
      a first portion located over a first surface of the conductive pillar, wherein the first surface faces away from the conductive member, wherein the first portion has a first concentration of a first component; and
      a second portion located adjacent to but not fully covering a second surface of the conductive pillar, wherein the second surface extends from the first surface towards the substrate, wherein the second portion has a second concentration of the first component greater than the first concentration, wherein the second portion comprises an intermetallic compound, the intermetallic compound having a thickness that is equal to or greater than about half of a width of the second portion.

2. The semiconductor device of claim 1, wherein the first component is silver.

3. The semiconductor device of claim 1, wherein the conductive pillar has a first width at a first point covered by the reflowable material and a second width less than the first width at a second point not covered by the reflowable material, wherein the first width is parallel to a major surface of the substrate.

4. The semiconductor device of claim 3, wherein the second width is between about 38 µm and about 68 µm.

5. The semiconductor device of claim 4, wherein the first width is between about 40 µm and about 70 µm.

6. The semiconductor device of claim 1, wherein the first concentration of the first component is between about 1.4% and about 2.2%.

7. The semiconductor device of claim 6, wherein the first component is silver, wherein the first portion has a third concentration of tin of between about 97.8% and about 98.6%.

8. The semiconductor device of claim 1, further comprising a barrier layer between the conductive pillar and the reflow able material.

9. The semiconductor device of claim 8, wherein the barrier layer comprises nickel.

10. A semiconductor device comprising:
    a continuous reflowable material over a substrate, the continuous reflowable material comprising:
       a first portion with a first concentration of a first component; and
       a second portion with a second concentration of the first component different from the first concentration of the first component;
    a conductive pillar extending between the first portion and the second portion, wherein a sidewall of the conductive pillar has a first part covered by the first portion and a second part uncovered by the continuous reflowable material, wherein the first portion has a width that is equal to or less than about 1 µm; and
    an underbump metallization in electrical connection with the conductive pillar.

11. The semiconductor device of claim 10, wherein the conductive pillar has a first width adjacent to the first part and a second width adjacent to the second part, the first width being larger than the second width.

12. The semiconductor device of claim 10, wherein the continuous reflowable material has a height over the conductive pillar, and wherein the first portion has a width that is between about 1% and about 5% of the height.

13. The semiconductor device of claim 10, wherein the first portion comprises an intermetallic compound.

14. The semiconductor device of claim 13, wherein the intermetallic compound has a thickness that is equal to or greater than about half of a width of the first portion.

15. The semiconductor device of claim 10, further comprising a barrier layer located between the conductive pillar and the continuous reflowable material.

16. A semiconductor device comprising:
    a conductive pillar over an underbump metallization over a substrate, wherein the conductive pillar comprises aluminum;
    a first reflowable material in physical contact with a first surface of the conductive pillar facing away from the substrate, the first reflowable material having a first concentration of a first component; and
    a second reflowable material in physical contact with a second surface of the conductive pillar, the second surface being perpendicular to the first surface, the second reflowable material having a second concentration of the first component, wherein a portion of the second surface remains free of the first reflowable material and the second reflowable material.

17. The semiconductor device of claim 16, further comprising a barrier layer between the conductive pillar and the second reflowable material.

18. The semiconductor device of claim 17, wherein a sidewall comprising the second surface and a surface of the barrier layer has a first height of between about 40 μm and about 70 μm.

19. The semiconductor device of claim 18, wherein the second reflowable material has a second height that is between about 5% and about 10% of the first height.

20. The semiconductor device of claim 17, wherein the barrier layer comprises nickel.

* * * * *